PULSE PRODUCING APPARATUS

Filed July 13, 1962

WITNESSES
Leon J. Vaza
James F. Young

INVENTORS
Emil T. Schonholzer and
Eugene M. Perrin
BY
Clement J. Paznokas
ATTORNEY

United States Patent Office 3,252,077

Patented May 17, 1966

3,252,077

PULSE PRODUCING APPARATUS

Emil T. Schonholzer, Depew, and Eugene M. Perrin, Buffalo, N.Y., assignors to Westinghouse Electric Corporation, East Pittsburgh, Pa., a corporation of Pennsylvania Filed July 13, 1962, Ser. No. 209,513
14 Claims. (Cl. 323—22)

This invention relates to pulse producing apparatus and, more particularly, to firing circuits for electric valves, for example, controlled rectifiers.

Properly timed firing circuits are used to fire controlled rectifiers. Many heretofore known firing circuits employ magnetic amplifiers. In such circuits if a sine wave supply is used for the saturable reactor, the result is an output pulse amplitude that is dependent on the firing angle of the reactor. A serious disadvantage of magnetic amplifier firing circuits for controlled rectifiers is the production of unwanted output pulses in response to negative control signals, which pulses are big enough to switch on sensitive controlled rectifiers such as solid state PNPN or NPNP switches. In a closed loop system, this would mean switching from negative to positive feedback.

In accordance with one embodiment of the invention, a magnetic amplifier firing circuit for electric valves is provided wherein output firing pulses in response to negative control of the reactor are eliminated by a circuit arrangement wherein a rectangular hysteresis core output transformer having a threshold response above negative control produced output signals of the amplifier saturable reactor is interposed between the reactor output and the control input of the control rectifier, and wherein uniform amplitude output pulses are obtained by providing a unique power input arrangement to the amplifier which performs the dual function of supplying alternating square waves and unidirectional bias current to the amplifier.

It is, therefore, an object of the present invention to provide a power input circuit which provides bias for the operating point and also eliminates output pulse magnitude dependency on the reactor firing angle in magnetic amplifier firing circuits for electric valves.

Another object is to provide magnetic amplifier apparatus with a power input circuit which has the dual function of providing operating point bias and square waves to power the amplifier apparatus.

A further object of the present invention is to provide such a power input circuit to a magnetic amplifier which has means to eliminate output in response to negative control signals.

Other and further objects and advantages of the present invention will be apparent from the following description, reference being had to the accompanying drawing wherein a preferred form of the present invention is clearly shown.

Figure 1:
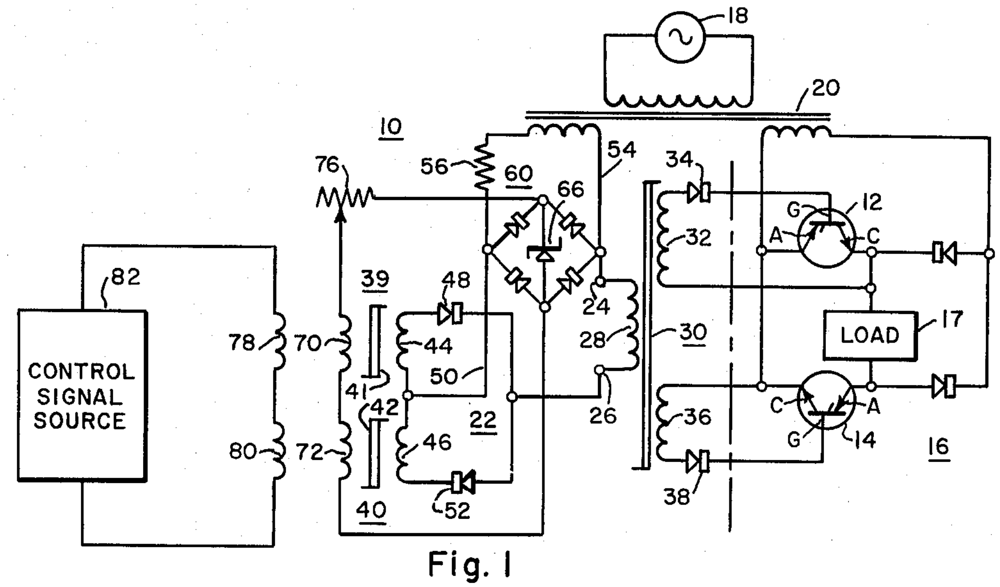
FIGURE 1 is a circuit diagram of a controlled rectifier firing circuit embodying features of the invention.

The circuit shown in FIG. 1 includes a pulse producing circuit 10 for controlling the conduction times of a pair of electric valves 12 and 14 in adjacent arms of a full wave bridge type power supply circuit 16 for a D.C. load 17. The bridge circuit is energized from an A.C. source 18 through a transformer 20. By way of example, the electric valves 12 and 14 are shown as semiconductor type controlled rectifiers. The particular examples shown are NPNP controlled rectifiers, each having an anode A, a cathode C and a gate G.

Controlled rectifiers are characterized in that with forward voltage applied to the device the device blocks the flow of forward current until the forward breakover voltage is reached, at which point the device switches into a high conduction state with high current flow and low voltage across the device. Thus, the devices have a hyperconductive negative resistance breakover characteristic. The forward voltage at which the device breaks down may be substantially reduced by applying a firing pulse between gate and cathode. Thus, the breakover voltage is adjustable. Once the device is fired by a pulse, and the pulse removed, conduction is maintained until the anode-cathode current falls below a sustaining value, as by going through zero during current reversal. While semiconductor type controlled rectifiers are shown, other types of controlled rectifiers, such as thyratrons, etc., may be employed. Although the firing circuit 10 may be employed to control any pulse-responsive electric valve, it is particularly advantageous in combination with controlled rectifiers.

The firing (gating) circuit 10 includes a magnetic amplifier 22 whose output terminals 24 and 26 are connected to the input winding 28 of a saturating transformer 30, which converts the amplifier output to suitable pulses for gating the controlled rectifiers 12 and 14. An output winding 32 of transformer 30 is connected through a diode 34 across the gate and cathode of controlled rectifier 12. Similarly, an output winding 36 of transformer 30 is connected through a rectifier 38 across the gate and cathode of controlled rectifier 14.

Amplifier 22 may be any suitable magnetic amplifier which has a higher gain for input signals of one polarity than the gain for input signals of the opposite polarity, for example, a self-saturating magnetic amplifier as shown at 22. This amplifier has a transfer charcteristic of the type shown in FIG. 2, and is biased at the heel of the curve as shown in that figure. From this characteristic, it is apparent that the gain in response to positive control ampere turns is considerably higher than the gain in response to negative control ampere turns. That is, the positive slope of the transfer characteristic is considerably steeper than the negative slope of the characteristic.

The particular amplifier 22, shown by way of example, is known as the doubler magnetic amplifier. It includes a pair of saturable reactors 39 and 40 having magnetic cores 41 and 42, respectively, on which are mounted load windings 44 and 46. Load winding 44 and a saturating recitfier 48 are connected in series between a power input line 50 and output terminal 26. Likewise, load winding 46 and a saturating rectifier 52 are connected in series between input line 50 and terminal 26. The other output terminal 24 of the amplifier is common with the other power input line 54. Power input lines 50 and 54 are connected through a current limiting resistor 56 to a secondary of transformer 20 whose primary is connected to the A.C. source 18. In order to supply a square wave to the amplifier a limiter circuit 60 is connected across the power input lines 50 and 54 to clip the sine wave applied to lines 50 and 54 by transformer 20. The limiter circuit 60 it formed by a full wave bridge type rectifier whose A.C. input is connected across A.C. lines 50 and 54, and whose D.C. diagonal has connected therein a constant voltage threshold device 66, such as the Zener diode shown. The A.C. waves are clipped at the threshold voltage value of the threshold device. In the case of the Zener diode, the clipping takes place at the Zener knee or breakdown voltage value. The clipped voltage supplied to the amplifier along lines 50 and 54 is illustrated at D in FIG. 3.

Amplifier 22 is biased to a desirable operation point, for example, cutoff, by a pair of bias windings 70 and 72 on cores 41 and 42, respectively, and energized from the D.C. output terminals of the bridge rectifier forming part of the limiter 60. Thus, the limiter 60 provides the dual function of unidirectional bias supply and clipper to provide square wave input to the amplifier. An adjustable resistor 76 is provided for bias control. The output of amplifier 22 is controlled through control windings 78 and 80 mounted on cores 41 and 42, and energized from a source 82, providing a suitable control signal, for example, a condition-responsive or regulatory signal. It will be appreciated that additional control windings may be employed through which independent signals may be magnetically mixed in the amplifier.

Figure 2:
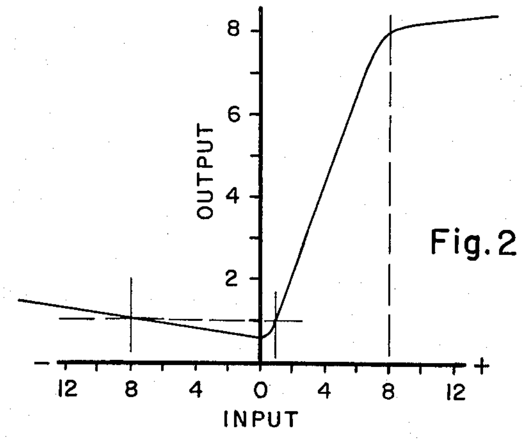
FIG. 2 is a graph illustrating the transfer characteristic of the magnetic amplifier in FIG. 1.

Assuming that the amplifier 22 is biased to cutoff, it will be see from FIG. 2, that the response of the amplifier to positive control signals within an operating range of numerical values extending from 1 to 8 input units is an output range extending from 1 to 8 output units, whereas the response to negative control signals within the same range of numerical values (1 to 8 control units) is an output range extending from just above zero (cutoff) to one unit of output. Transformer 30 is arranged to have an input threshold response level above the amplifier output levels produced by negative input signals to which the amplifier may be environmentally subjected, for example, to negative signals in the same range of numerical values as the operating range of the positive input signals.

Transformer 30 has a core made of square hysteresis loop material, for example Hypernik V. For this reason, a certain initial excitation ampere-turns increment is required to produce any voltage on the output windings 32 and 36. Thus, the transformer has an input threshold response level below which it will not produce an output voltage. In the particular example disclosed, the output transformer is arranged to have a threshold level above 1 amplifier output unit, which is the amplifier output due to a negative signal input of 8 units or to a positive input signal of 1 unit.

The square wave power input to the amplifier provides square wave output pulses when the amplifier reactors are fired, thus providing substantially uniform pulse amplitude during the duration of the pulse. An example of amplifier output supplied to the load connected to the output terminals 24 and 26 in response to a given positive input signal, is shown at (E) in FIG. 3, wherein angles $X_1$ and $X_2$ are the firing angles of the respective reactors of the amplifier. As is well known, the firing angle of a magnetic amplifier may be varied, retarded or advanced, by changing the magnitude of the control signal supplied to the control winding or windings of the amplifier.

Figure 3:
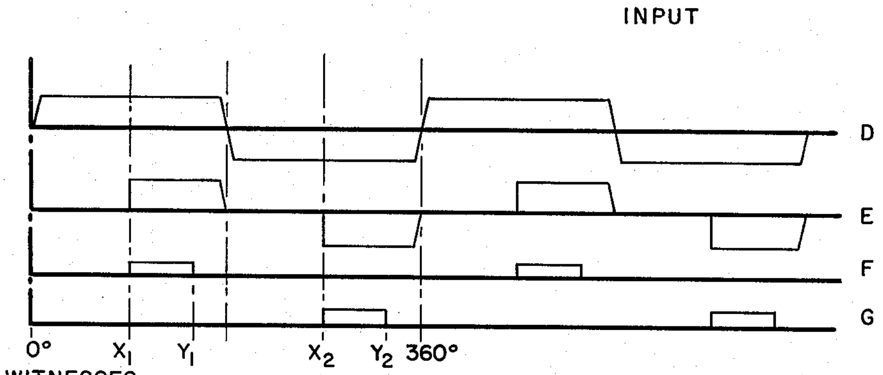
FIG. 3 is a chart showing wave forms at different points in the apparatus.

Assuming that the output of the amplifier depicted at E in FIG. 3 is above the threshold level of transformer 30, the output windings 32 and 36 of the transformer will produce output pulses which are typified at F and G in FIG. 3. When one of the amplifier reactors fires at angle $X_1$ in one-half cycle a voltage pulse F is induced in the windings 32 and 36 having a leading edge at approximately the angle $X_1$. The voltage pulse F which begins with the firing angle $X_1$ of one of the amplifier reactors, terminates at $Y_1$, the angle at which transformer 30 saturates. On the next half-cycle the other reactor fires at angle $X_2$ and pluses G are produced in windings 32 and 36 in the same manner. Pulses G start at angle $X_2$ and end at angle $Y_2$ when transformer 30 saturates. Resistor 56 helps to limit current due to heavy loading when transformer 30 saturates. On one-half cycle, pulses are blocked by rectifier 38 and unblocked by rectifier 34, while on the next half-cycle, rectifier 34 blocks the pulses while rectifier 38 freely passes the pulses. In this manner firing pulses are alternately applied to the gate circuits of controlled rectifiers 12 and 14, thus alternately firing the respective controlled rectifiers. The average current passed by the controlled rectifiers 12 and 14 is dependent on their firing or gating angle at which conduction is initiated. This angle may be advanced or retarded by advancing or retarding the firing angle of the amplifier 22.

Figure 4:
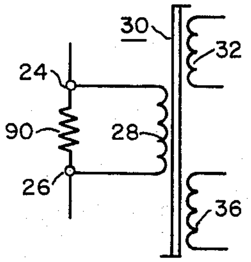
FIG. 4 is a modification of a portion of the circuit in FIG. 1.

A variation of a portion of the firing circuit 10 is shown in FIG. 4 wherein a resistor 90 is shown connected across the input of transformer 30. This resistor provides two effects. It normalizes or provides stability or constancy to the width of the firing pulses provided by transformer 30. Resistor 90 also raises the input threshold level of transformer 30. At least a part of the rise in the threshold level is due to the current shunting effect of the resistor. However, the percentage rise in the threshold level of the transformer due to resistor 90 is so much greater than would be expected by the percentage of current expected to be shunted by the resistor, that a satisfactory explanation for this phenomena is not known. It will be appreciated that with or without the resistor 90, the "total" threshold level of transformer 30 will be arranged to avoid response to negative input signals to the amplifier. In one operating example of the firing circuit described herein, the voltage source 18 produced 115 volts, the limiting circuit 60 clipped the input voltage to approximately 24 volt square waves. In the same operating example resistors 56 and 90 were each 1000 ohms, and transformer 30 had a ratio of approximately 2½ to 1, to provide output firing pulses of approximately 9 volts each at open circuit.

It is to be understood that the herein described arrangements are simply illustrative of the principles of the invention, and that other embodiments and applications are within the spirit and scope of the invention.

We claim as our invention:

1. Pulse producing apparatus comprising a magnetic amplifier, means for producing square waves comprising a full wave rectifier with D.C. output terminals and with A.C. input terminals for connection to a source of A.C., and a threshold device connected across said D.C. output terminals, whereby A.C. supplied to said input terminals is clipped to provide square waves, means for energizing said amplifier with said square waves, and means energized from the D.C. output of said rectifier for biasing said amplifier to a desired operating point.

2. Pulse producing apparatus comprising a magnetic amplifier, means for producing square waves comprising a full wave bridge rectifier with D.C. output terminals and with A.C. input terminals for connection to a source of A.C., and a Zener diode connected across said D.C. output terminals, whereby A.C. supplied to said input terminals is clipped to provide square waves, means for energizing said amplifier with said square waves, and means energized from the D.C. output of said rectifier for biasing said amplifier to a desired operating point.

3. Pulse producing apparatus comprising a magnetic amplifier, means for producing square waves comprising a full wave rectifier with D.C. output terminals and with A.C. input terminals for connection to a source of A.C., and a threshold device connected across said D.C. output terminals, whereby A.C. supplied to said input terminals is clipped to provide square waves, means for energizing said amplifier with said square waves, means energized from the D.C. output of said rectifier for biasing said amplifier to a desired operating point, and an electric valve controlled by said magnetic amplifier.

4. Control apparatus comprising: first means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves; a magnetic amplifier coupled to said first means to be energized by said square waves, said amplifier having a high gain for input control signals of given polarity and a low gain for input signals of opposite polarity; means energized by the D.C. output of said rectifier for biasing said amplifier; and pulse producing threshold means responsive to the output of said amplifier for producing output pulses when the amplifier output is above a predetermined threshold value, said threshold means being inoperative to produce output pulses when the amplifier output is below said threshold value.

5. Control apparatus comprising: first means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves; a magnetic amplifier coupled to said first means to be energized by said square waves, said amplifier having a high gain for input control signals of given polarity and a low gain for input signals of opposite polarity; means energized by the D.C. output of said rectifier for biasing said amplifier; and pulse producing threshold means responsive to the output of said amplifier for producing output pulses when the amplifier output is above a predetermined threshold value, said threshold means being inoperative to produce output pulses when the amplifier output is below said threshold value, and an electric valve controlled by said output pulses.

6. Control apparatus comprising: first means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves; a magnetic amplifier coupled to said first means to be energized by said square waves, said amplifier having a high gain for input control signals of given polarity and a low gain for input signals of opposite polarity; means energized by the D.C. output of said rectifier for biasing said amplifier; and pulse producing threshold means responsive to the output of said amplifier for producing output pulses when the amplifier output is above a predetermined threshold value, said threshold means being inoperative to produce output pulses when the amplifier output is below said threshold value, said threshold means comprising a rectangular hysteresis core transformer.

7. The combination as in claim 6, wherein said threshold means further includes a resistor connected across the input of said transformer.

8. Control apparatus comprising: first means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves; a magnetic amplifier coupled to said first means to be energized by said square waves, said amplifier having a high gain for input control signals of given polarity and a low gain for input signals of opposite polarity; means energized by the D.C. output of said rectifier for biasing said amplifier; pulse producing threshold means responsive to the output of said amplifier for producing output pulses when the amplifier output is above a predetermined threshold value, said threshold means being inoperative to produce output pulses when the amplifier output is below said threshold value, said threshold means comprising a rectangular hysteresis core transformer; and a controlled rectifier connected to be controlled by said output pulses.

9. Control apparatus comprising: first means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves; a magnetic amplifier coupled to said first means to be energized by said square waves, said amplifier having a high gain for input control signals of given polarity and a low gain for input signals of opposite polarity; means energized by the D.C. output of said rectifier for biasing said amplifier; and pulse producing threshold means responsive to the output of said amplifier for producing output pulses when the amplifier output is above a predetermined threshold value, said threshold means being inoperative to produce output pulses when the amplifier output is below said threshold value, said amplifier providing an output exceeding said threshold value in response to input signals of said given polarity in an operating range of numerical values, the output of said amplifier in response to opposite polarity input signals in said range of numerical values being below said threshold value, said threshold means comprising a rectangular hysteresis core transformer.

10. Control apparatus comprising: first means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves; a magnetic amplifier coupled to the latter means to be energized by said square waves, said amplifier having a high gain for input control signals of given polarity and a low gain for input signals of opposite polarity, said amplifier having winding means energized by the D.C. output of said rectifier to set the operating point of the amplifier; pulse producing threshold means responsive to the output of said amplifier for producing output pulses when the amplifier output is above a predetermined threshold value, said threshold means comprising a rectangular hysteresis core transformer, said threshold means being inoperative to produce output pulses when the amplifier output is below said threshold value, said amplifier providing an output exceeding said threshold value in response to input signals of said given polarity in an operating range of numerical values, the output of said amplifier in response to opposite polarity input signals in said range of numerical values being below said threshold value; and a controlled rectifier connected to be controlled by the output pulses of said threshold means.

11. In pulse providing apparatus operative with an input signal, the combination of square wave signal providing means comprising a full wave rectifier with D.C. output terminals and with A.C. input terminals for connection to a source of A.C., and a threshold device connected across said D.C. output terminals whereby A.C. supplied to said input terminals is clipped to provide square waves, magnetic amplifier means energized by said square wave signal providing means and responsive to input signals of given polarity for providing a high gain first output signal and responsive to input signals of opposite polarity for providing a low gain second output signal, means energized from the D.C. output of said rectifier for biasing said amplifier, and signal conversion means having a predetermined minimum signal threshold value for providing an output pulse, said signal conversion means being related to said first and second output signals such that said high gain first output signal is greater than said threshold value and an output pulse is provided, while said low gain second output signal is less than said threshold value, and an output pulse is not provided.

12. In pulse providing apparatus operative with an input signal, the combination of square wave signal providing means comprising a full wave bridge rectifier with D.C. output terminals and with A.C. input terminals for connection to an A.C. source, and a Zener diode connected across said D.C. output terminals, whereby A.C. supplied to said A.C. input terminals is clipped to provide square waves, magnetic amplifier means energized by said square wave signal providing means and responsive to input signals of given polarity for providing a high gain first output signal and responsive to input signals of opposite polarity for providing a low gain second output signal, said magnetic amplifier means having winding means energized from the D.C. output of said rectifier to set the operating point of the amplifier means, signal conversion means having a predetermined minimum signal threshold value for providing an output pulse, said signal conversion means being related to said first and second output signals such that said high gain first output signal is greater than said threshold value and an output pulse is provided, while said low gain second output signal is less than said threshold value and an output pulse is not provided, and an electric valve controlled by the output pulses of said signal conversion means.

13. Control apparatus comprising a magnetic amplifier having a high gain for input control signals of given polarity and a low gain for input signals of opposite polarity, said amplifier providing a certain output value in response to a given valued input signal of said given polarity, said amplifier requiring a higher-valued input signal of said opposite polarity to provide said certain output value, means for producing square waves comprising a full wave rectifier with D.C. output terminals and with A.C. input terminals for connection to a source of A.C., and a threshold device connected across said D.C. output terminals whereby A.C. supplied to said input terminals is clipped to provide square waves, means for energizing said amplifier with said square waves, means energized from the D.C. output of said rectifier for biasing said amplifier, and pulse producing threshold means responsive to the output of said amplifier, said threshold means having an input threshold value above said certain output value, whereby said threshold means provides output pulses in response to only those input signals to said threshold means at least equaling said threshold value.

14. Control apparatus comprising a magnetic amplifier having a high gain for input control signals of given polarity and a low gain for input signals of opposite polarity, said amplifier providing a certain output value in response to a given valued input signal of said given polarity, said amplifier requiring a higher-valued input signal of said opposite polarity to provide said certain output value, means for producing square waves comprising a full wave bridge rectifier with D.C. output terminals and with A.C. input terminals for connection to an A.C. source, and a Zener diode connected across said D.C. output terminals, whereby A.C. supplied to said A.C. input terminals is clipped to provide square waves, means for energizing said amplifier with said square waves, said amplifier having winding means energized from the D.C. output of said rectifier to set the amplifier to a desired operating point, pulse producing threshold means responsive to the output of said amplifier, said threshold means having an input threshold value above said certain output value, whereby said threshold means provides output pulses only in response to input signals to said threshold means that at least equal said threshold value, and an electric valve controlled by the output pulses of said threshold means.

References Cited by the Examiner

UNITED STATES PATENTS

| | | | |
|---|---|---|---|
| 3,010,062 | 11/1961 | Van Emden | 321—18 |
| 3,088,075 | 4/1963 | Pintell | 307—88.5 |

FOREIGN PATENTS

| | | |
|---|---|---|
| 1,223,860 | 2/1960 | France. |

LLOYD McCOLLUM, *Primary Examiner.*

X. HADLAND, K. D. MOORE, *Examiners.*